US008599053B2

(12) United States Patent
Quiquempoix et al.

(10) Patent No.: US 8,599,053 B2
(45) Date of Patent: Dec. 3, 2013

(54) SWITCHED-CAPACITANCE GAIN AMPLIFIER WITH IMPROVED INPUT IMPEDANCE

(75) Inventors: Vincent Quiquempoix, Divonne les Bains (FR); Philippe Deval, Lutry (CH); Fabien Vaucher, Lausanne (CH)

(73) Assignee: Microchip Technology Incorporated, Chandler, AZ (US)

( * ) Notice: Subject to any disclaimer, the term of this patent is extended or adjusted under 35 U.S.C. 154(b) by 54 days.

(21) Appl. No.: 13/325,248

(22) Filed: Dec. 14, 2011

(65) Prior Publication Data
US 2012/0161994 A1 Jun. 28, 2012

Related U.S. Application Data

(60) Provisional application No. 61/426,196, filed on Dec. 22, 2010.

(51) Int. Cl.
*H03M 3/00* (2006.01)
(52) U.S. Cl.
USPC .......................................... 341/143; 341/155
(58) Field of Classification Search
USPC .......... 341/143, 155, 120, 172, 110, 156, 157
See application file for complete search history.

(56) References Cited

U.S. PATENT DOCUMENTS

| | | | |
|---|---|---|---|
| 6,617,838 B1 * | 9/2003 | Miranda et al. ........... | 324/117 R |
| 6,744,394 B2 * | 6/2004 | Liu et al. ........................ | 341/155 |
| 7,167,119 B1 | 1/2007 | Lei et al. ........................ | 341/143 |
| 2003/0210166 A1 | 11/2003 | Liu et al. ........................ | 341/172 |
| 2006/0114049 A1 | 6/2006 | Josefsson ........................ | 327/337 |

OTHER PUBLICATIONS

Invitation to Pay Additional Fees, and, Where Applicable, Protest Fee and Partial Search Report, PCT/US2011/065821, 9 pages, May 18, 2012.
International PCT Search Report and Written Opinion, PCT/US2011/065821, 21 pages, Jul. 13, 2012.

* cited by examiner

*Primary Examiner* — Joseph Lauture
(74) *Attorney, Agent, or Firm* — King & Spalding L.L.P.

(57) ABSTRACT

A gain amplifier may have a differential amplifier with feedback capacitors; a switched input stage having first and second outputs coupled with the differential amplifier, and having: first and second capacitors, a first input receiving a first signal of a differential input signal; a second input receiving a second signal of the differential input signal; a first plurality of switches controlled by a first clock signal to connect the first terminals of the first capacitor with the first or second input, respectively and to connect the first terminals of the second capacitors with the second and first input, respectively; and a second plurality of switches controlled by a phase shifted clock signal to connect the second terminal of the first capacitor with a first or second input of the differential amplifier and connecting the second terminal of the second capacitor with the second or first input of the differential amplifier.

41 Claims, 3 Drawing Sheets

SWITCHED-CAPACITANCE GAIN AMPLIFIER WITH IMPROVED INPUT IMPEDANCE

CROSS-REFERENCE TO RELATED APPLICATIONS

This application claims the benefit of U.S. Provisional Application No. 61/426,196 filed on Dec. 22, 2010, entitled "SWITCHED-CAPACITANCE PGA WITH IMPROVED INPUT IMPEDANCE", which is incorporated herein in its entirety.

TECHNICAL FIELD

This application concerns a circuit for a switched-capacitance gain amplifier, for example a programmable gain amplifier (PGA), with improved input impedance.

BACKGROUND

Figure 4:
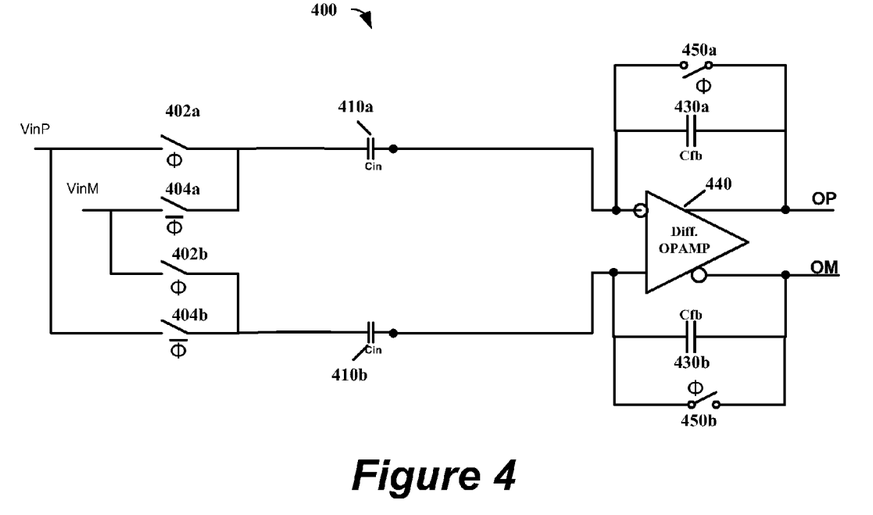
FIG. 4 shows a conventional implementation of a gain amplifier.

Gain amplifiers usually form an input stage of a switched analog to digital converter (ADC). FIG. 4 shows an example of such a gain amplifier 400. A differential input signal VinP, VinM is fed to a differential amplifier 440 via a switched capacitor network. The switched capacitor network comprises two capacitors 410a, b which are switched in the input signal path of the differential amplifier 440 by means of switches 402 and 404. A first terminal of capacitor 410a is coupled through switches 402a and 404a with either the non-inverting or inverting input signal VinP, VinM. Similarly, the first terminal of capacitor 410b is coupled with either the non-inverting or inverting input signal VinP, VinM via switches 402b or 404b. Switches 402a and 404b are controlled by clock signal $\Phi$ and switches 404a and 402b by the inverted clock signal #$\Phi$. The second terminal of capacitors 410a and 410b are coupled directly with the non-inverting and inverting input of differential amplifier 440, respectively. The differential amplifier 440 comprises a differential output and feedback capacitors 430a, b in the non-inverting and inverting signal path. To prevent the differential amplifier 440 to integrate all signals at its input, switches 450a and 450b are controlled to reset the differential amplifier 440. FIG. 4, thus shows a typical conventional circuit, wherein in order to have a switching on phase at the outputs of the amplifier 440, The switches 450a/b are switching with the phase $\Phi$.

When $\Phi$ is on (phase $\Phi$), the amplifier is reset and capacitor 410a is switched from VinM to VinP while capacitor 410b is switched from VinP to VinM. The charge change on the capacitor 410a between phases #$\Phi$ and $\Phi$ is then $\Delta$QIN (410a)=CIN(VinP−VinM). The charge change on the capacitor 410b between #$\Phi$ and $\Phi$ is then $\Delta$QIN (410b)=CIN (VinM−VinP). The differential charge difference stored on the caps 410a,b between phases #$\Phi$ and $\Phi$ is then:

$$\Delta QIN(\#\Phi,\Phi)=\Delta QIN(410a)-\Delta QIN(410b)=2CIN(VinP-VinM).$$

Figure 5:
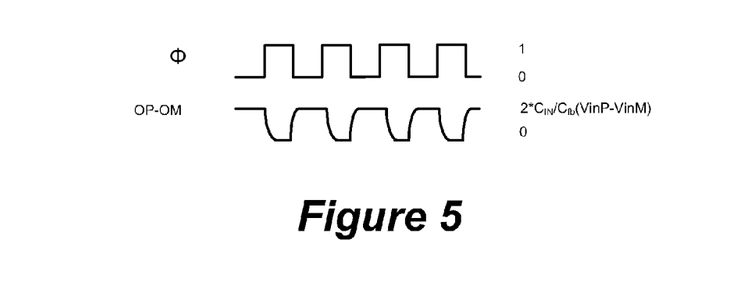
FIG. 5 shows a switching scheme associated with the conventional implementation shown in FIG. 4.

FIG. 5 shows the associated switching control signal $\Phi$ and output voltage OP-OM. The analog amplifier output signal OP-OM toggles between 0 an $2C_{IN}/C_{FB}$(VinP−VinM). The charge difference $\Delta$QIN is transferred to the output voltage of the operational amplifier with a gain of 1/Cfb. The problem with this algorithm is that in this case the charge is pulled from the input during both phases $\Phi$ and #$\Phi$ while it is only transferred once (during #$\Phi$). The differential input impedance averaged during a cycle ($\Phi$ phase then #$\Phi$ phase) is equal to:

$Z_{IN}$ diff=1/f*Output Voltage transferred/($\Delta Q_{IN}$ ($\Phi$,#$\Phi$)−$\Delta Q_{IN}$(#$\Phi$, $\Phi$)) where f is the frequency of the full cycle ($\Phi$ phase then #$\Phi$ phase). So, $Z_{IN}$ diff=1/(2f*$C_{IN}$). The input impedance only depends on $C_{IN}$ and the frequency f of the cycle.

This low input impedance, which is typical in switched capacitance type ADCs (like the sigma-delta ADCs), results from the fact that the input is a capacitance that is switched back and forth to sample the input signals. The problem is that in low-noise ADCs, the noise (especially thermal noise) is also inversely proportional to the capacitance (thermal noise is a multiple of $kT/C_{IN}$, wherein T being the absolute temperature. So if the capacitance is smaller, the input impedance is better but the noise is larger.

Hence, there is a need for a switched-capacitance gain amplifier with an improved input capacitance.

SUMMARY

According to various embodiments, the input impedance of a switched capacitance gain amplifier input circuit is improved in order to connect to high source impedance sensors. This improvement needs to be realized with the same gain and the same noise floor than the standard switched cap gain amplifier solution.

Improving the input impedance while not degrading noise is important in ADC trade offs and permit to interface with new range of sensors with less active input circuitry in the front end of the ADCs and have a total cost for the application slightly lower.

According to an embodiment, a gain amplifier may comprise a differential amplifier comprising feedback capacitors; a switched input stage having a first and second output coupled with the differential amplifier, and comprising first and second capacitors, a first input receiving a first signal of a differential input signal; a second input receiving a second signal of the differential input signal; a first plurality of switches controlled by a first clock signal to connect the first terminals of the first capacitor with said first or second input, respectively and to connect the first terminals of the second capacitors with said second and first input, respectively; and a second plurality of switches controlled by a phase shifted clock signal to connect the second terminal of the first capacitor with a first or second input of the differential amplifier and connecting the second terminal of the second capacitor with the second or first input of the differential amplifier.

According to a further embodiment, the phase shifted signal can be the clock signal shifted by ¼ period. According to a further embodiment, the first plurality of switches may comprise a first switch coupled between the first input and the first terminal of the first capacitor; a second switch coupled between the second input and the first terminal of the first capacitor; a third switch coupled between the first input and the first terminal of the second capacitor; a fourth switch coupled between the second input and the first terminal of the second capacitor; wherein the first and third switch are controlled by the clock signal and the second and fourth switch are controlled by an inverted clock signal. According to a further embodiment, the second plurality of switches may comprise a fifth switch coupled between the second terminal of the first capacitor and the first input of the differential amplifier; a sixth switch coupled between the second terminal of the second capacitor and the first input of the differential amplifier; a seventh switch coupled between the second terminal of the first capacitor and the second input of the differential amplifier; a eighth switch coupled between the second terminal of the second capacitor and the second input of the differential amplifier; wherein the fifth and eighth switch are controlled by the phase shifted clock signal and the sixth and seventh switch are controlled by an inverted phase shifted signal. According to a further embodiment, the differential amplifier may integrate the input signal by means of a first and second feedback capacitor. According to a further embodiment, the gain amplifier may further comprise first and second reset switches coupled in parallel to a first and second feedback capacitor and controlled by a control signal. According to a further embodiment, the control signal may have twice the frequency of the clock signal. According to a further embodiment, the control signal can be generated by an exclusive or gate coupled with the clock signal and the shifted clock signal. According to a further embodiment, the gain amplifier may further comprise at least one switchable feedback network in each feedback loop which can be switched in parallel to said feedback capacitor to control the gain of said gain amplifier. According to a further embodiment, the switchable feedback network may comprise first and second coupling switches connected to a further feedback capacitor and operable to couple the further capacitor in parallel with a feedback capacitor. According to a further embodiment, the switchable feedback network may comprise a reset switch which couples the further feedback capacitor with a common mode voltage. According to a further embodiment, the gain amplifier may further comprise a third and fourth capacitor; wherein the first plurality of switches are controlled by the first clock signal to connect the first terminals of the first and third capacitors with said first and second input, respectively while shorting the first terminals of the second and fourth capacitors or to connect the first terminals of the second and fourth capacitors with said first and second input, respectively while shorting the first terminals of the first and third capacitors; and wherein the second plurality of switches are controlled by the phase shifted clock signal to connect the second terminals of the first and third capacitors with a first input of the differential amplifier while connecting the second terminals of the second and fourth capacitors with the second input of the differential amplifier or to connect the second terminals of the first and third capacitors with a second input of the differential amplifier while connecting the second terminals of the second and fourth capacitors with the first input of the differential amplifier. According to a further embodiment, the first plurality of switches may comprise a first switch coupled between the first input and the first terminal of the first capacitor; a second switch coupled between the second input and the first terminal of the third capacitor; a third switch coupled between the first terminals of the first and third capacitor; a fourth switch coupled between the first input and the first terminal of the fourth capacitor; a fifth switch coupled between the second input and the first terminal of the second capacitor; a sixth switch coupled between the first terminals of the second and fourth capacitor; wherein the first, second and sixth switch is controlled by the clock signal and the third, fourth and fifth switch is controlled by an inverted clock signal. According to a further embodiment, the second plurality of switches may comprise a seventh switch coupled between the second terminal of the first and third capacitors and the first input of the differential amplifier; an eight switch coupled between the second terminal of the second and fourth capacitors and the first input of the differential amplifier; a ninth switch coupled between the second terminal of the first and third capacitors and the second input of the differential amplifier; a tenth switch coupled between the second terminal of the second and fourth capacitors and the second input of the differential amplifier; wherein the seventh and tenth switch are controlled by the phase shifted clock signal and the eight and ninth switch are controlled by an inverted phase shifted signal. According to a further embodiment, the gain amplifier may further comprise a third input receiving a common mode voltage and a third plurality of switches operable to individually connect the first terminals of said first, second, third and fourth capacitors with the common mode voltage. According to a further embodiment, the common mode voltage can be ground. According to a further embodiment, the gain amplifier may further comprise first and second reset switches coupled in parallel to a first and second feedback capacitor. According to a further embodiment, the gain amplifier may further comprise at least one switchable feedback network in each feedback loop which can be switched in parallel to said feedback capacitor to control the gain of said gain amplifier. According to a further embodiment, the switchable feedback network may comprise first and second coupling switches connected to a further feedback capacitor and operable to couple the further capacitor in parallel with a feedback capacitor. According to a further embodiment, the switchable feedback network may comprise a reset switch which couples the further feedback capacitor with a common mode voltage.

According to another embodiment, a method for operating a gain amplifier with a differential amplifier comprising feedback capacitors, may comprise: switching a first terminal of a first capacitor to connect with a first or second input and switching a first terminal of a second capacitor to connect with a second or first input depending on a clock signal; and switching the second terminals of the first and second capacitor to connect to either a first or second input of the differential amplifier according to a phase shifted clock signal.

According to a further embodiment of the method, the phase shifted signal is the clock signal shifted by ¼ period of the clock signal. According to a further embodiment of the method, the differential amplifier may comprise feedback capacitors and is controlled to integrated the input signals. According to a further embodiment of the method, the differential amplifier may comprise feedback capacitors and parallel reset switches which are controlled to short the feedback capacitors with a control signal. According to a further embodiment of the method, the control signal may have twice the frequency of the clock signal. According to a further embodiment of the method, the control signal can be generated by an exclusive or of the clock signal and the shifted clock signal. According to a further embodiment of the method, the method may further comprise connecting the first terminals of at least one of said first, second, capacitors with a common mode voltage to define a reset state. According to a further embodiment of the method, the common mode voltage can be ground. According to a further embodiment of the method, the method may further comprise switching at least one switchable feedback network in parallel to said feedback capacitor to control the gain of said gain amplifier. According to a further embodiment of the method, the switchable feedback network may comprise first and second coupling switches connected to a further feedback capacitor and operable to couple the further capacitor in parallel with a feedback capacitor. According to a further embodiment of the method, the method may further comprise coupling the further feedback capacitor with a common mode voltage to define a reset state. According to a further embodiment of the method, third and fourth capacitors are provided for sampling, and the method may further comprise: switching first terminals of the first and third capacitor to connect with the first and second input, respectively while shorting first terminals of the second and fourth capacitor when the clock signal is in a first state and switching first terminals of the second and fourth capacitor to connect with the second and first input, respectively while shorting first terminals of the first and third capacitor when the clock signal is in a second state; switching the second terminal of the first and fourth capacitor to connect to the first input of the differential amplifier and the second terminal of the second and third capacitor to connect to the second input of the differential amplifier when the phase shifted clock signal is in a first state and switching the second terminal of the first and fourth capacitor to connect to the second input of the differential amplifier and the second terminal of the second and third capacitor to connect to the first input of the differential amplifier when the phase shifted clock signal is in a second state. According to a further embodiment of the method, the switching of the first terminals of the first and third capacitors can be performed by a first switch coupled between the first input and the first terminal of the first capacitor; and a second switch coupled between the second input and the first terminal of the third capacitor; the shorting of the second and fourth capacitors is performed by a third switch coupled between the first terminals of the second and fourth capacitor; the switching of the first terminals of the second and fourth capacitors is performed by a fourth switch coupled between the first input and the first terminal of the second capacitor; a fifth switch coupled between the second input and the first terminal of the fourth capacitor; and the shorting of the first and third capacitor is performed by a sixth switch coupled between the first terminals of the first and third capacitor. According to a further embodiment of the method, the first, second and sixth switch can be controlled by the clock signal and the third, fourth and fifth switch is controlled by an inverted clock signal. According to a further embodiment of the method, switching the second terminals of the first and fourth capacitor can be performed by a seventh switch coupled between the second terminal of the first and fourth capacitors and the first input of the differential amplifier; and an eight switch coupled between the second terminal of the first and fourth capacitors and the second input of the differential amplifier; and the switching the second terminals of the second and third capacitor can be performed by a ninth switch coupled between the second terminal of the second and third capacitors and the first input of the differential amplifier; a tenth switch coupled between the second terminal of the second and third capacitors and the second input of the differential amplifier; wherein the seventh and ninth switch are controlled by the phase shifted clock signal and the eight and tenth switch are controlled by an inverted phase shifted signal. According to a further embodiment of the method, the method may further comprise connecting the first terminals of at least one of said first, second, third, and fourth capacitors with a common mode voltage to define a reset state. According to a further embodiment of the method, the common mode voltage can be ground. According to a further embodiment of the method, the differential amplifier may comprise feedback capacitors and parallel reset switches which are controlled to short the feedback capacitors with a control signal. According to a further embodiment of the method, the control signal may have twice the frequency of the clock signal. According to a further embodiment of the method, the control signal can be generated by an exclusive or of the clock signal and the shifted clock signal. According to a further embodiment of the method, the method may further comprise switching at least one switchable feedback network in parallel to a feedback capacitor to control the gain of said gain amplifier. According to a further embodiment of the method, the switchable feedback network may comprise first and second coupling switches connected to a further feedback capacitor and operable to couple the further capacitor in parallel with a feedback capacitor. According to a further embodiment of the method, the method may further comprise coupling the further feedback capacitor with a common mode voltage to define a reset state.

According to yet another embodiment, a Sigma delta analog to digital converter may comprise a gain amplifier comprising: a differential amplifier comprising feedback capacitors; a switched input stage having a first and second output coupled with the differential amplifier, comprising: a first, second, third and fourth capacitor, wherein the first and second capacitor form a first set wherein second terminals of the first and second capacitors are connected and third and fourth capacitors form a second set wherein second terminals of the third and fourth capacitors are connected; a first input receiving a non-inverted input signal; a second input receiving an inverted input signal; a first plurality of switches controlled by a first clock signal to connect the first terminals of the capacitors of the first set with said first and second input, respectively while shorting the first terminals of the capacitors of the second set or to connect the first terminals of the capacitors of the second set with said first and second input, respectively while shorting the first terminals of the capacitors of the first set; and a second plurality of switches controlled by a phase shifted clock signal to connect the second terminals of the capacitors of the first set with a first input of the differential amplifier while connecting the second terminals of the capacitors of the second set with the second input of the differential amplifier or to connect the second terminals of the capacitors of the first set with a second input of the differential amplifier while connecting the second terminals of the capacitors of the second set with the first input of the differential amplifier.

DETAILED DESCRIPTION

According to various embodiments, the input impedance can be basically doubled or quadrupled while keeping the same input referred noise in a switched capacitance gain amplifier. This can be used to lower the noise and keep the same input impedance or to keep the same noise and have larger input impedance depending on the size of the input capacitance.

In order to improve the input impedance of a gain amplifier, the input current needs to be reduced while transferring the same differential output voltage. According to various embodiments, the input frequency of the phase Φ can be divided by two while transferring the same output voltage.

The input impedance is doubled compared to a conventional circuit by the addition of the switches between the capacitor and the input of the operational amplifier, and the reduced frequency of the Φ/PA switching. The doubling of the impedance results from the switching frequency at the inputs which is cut in half.

According to various embodiments, the input impedance can be further doubled, thus quadrupled compared to conventional circuits, as for example shown in FIG. 4, by the addition of 2 capacitances and further switches on the input side because now all the transfers at the inputs are with a difference of differential charge of $C_{IN}*$(VinP−VinM) instead of $2*C_{IN}*$(VinP−VinM). Here the doubling of the input impedance is due to the fact that all charge transfers on the caps connected to the inputs are between half the voltages than the conventional circuit.

Figure 1:
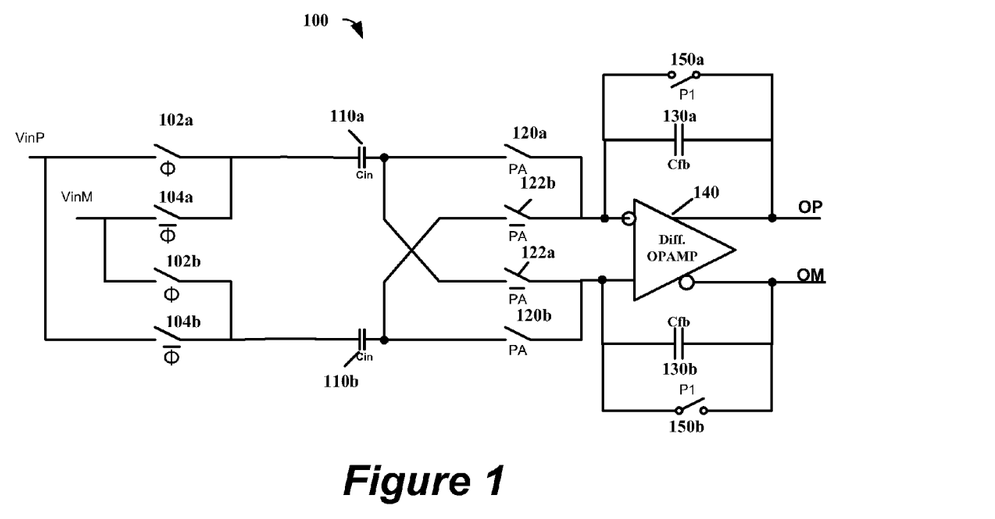
FIG. 1 shows a first embodiment of an improved gain amplifier.

FIG. 1 shows a first example of a gain amplifier wherein the input impedance is doubled. Again, a differential input signal VinP, VinM is fed to a differential amplifier 140 via a switched capacitor network. The switched capacitor network comprises two capacitors 110a, b which are switched in the input signal path of the differential amplifier 140 by means of switches 102, 104, 120, and 122. A first terminal of capacitor 110a is coupled through switches 102a and 104a with either the non-inverting or inverting input signal VinP, VinM. Similarly, the first terminal of capacitor 110b is coupled with either the non-inverting or inverting input signal VinP, VinM via switches 102b or 104b. Switches 102a and 102b are controlled by clock signal Φ and switches 104a and 104b by the inverted clock signal #Φ. The second terminal of capacitor 110a is coupled with either the non-inverting or inverting input of differential amplifier 140 via switches 120a and 122a. Switches 120b and 122b perform the same function for the second terminal of capacitor 110b. The differential amplifier 140 comprises a differential output and a feedback capacitor 130a, b in the non-inverting and inverting signal path. Switches 120a,b are controlled by phase clock PA and switches 122a, b are controlled by the inverted phase clock signal #PA. Phase clock signal PA is generally identical to the clock signal Φ but shifted by ¼ of the period of the clock Φ. According to various embodiments, the addition of the switches 120 and 122 induce a gain of a factor of 2 for the input impedance when compared to the conventional structure as shown in FIG. 4 where there is a direct connection from $C_{IN}$ to the inputs of the operational amplifier 440. In addition to this, these switches 120 and 122 induce a chopper algorithm at the input of the operational amplifier 140, leading to an offset cancellation when the outputs of the operational amplifier 140 are averaged.

Figure 2:
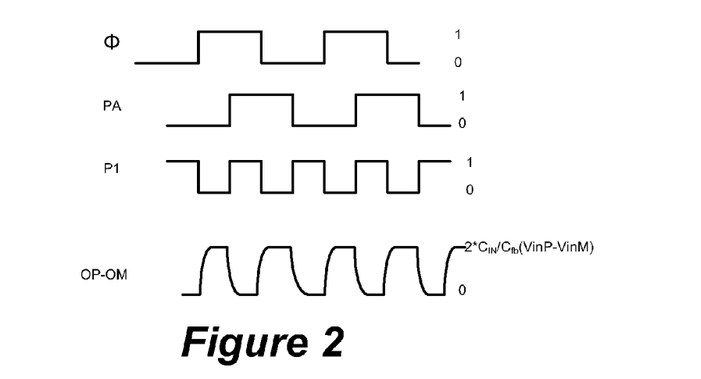
FIG. 2 shows a switching scheme associated with the first embodiment

As shown in FIG. 2, the phase clock signal PA controlling switches 120 and 122 is shifted by ¼ clock period compared to Φ so that the output can toggle between 0 and $C_{IN}/C_{FB} \cdot 2$ (VinP−VinM). According to various embodiments, as further shown in FIG. 2, the analog output signal OP-OM can toggle at a P1 frequency which is twice as fast as Φ or PA without having to switch the inputs at the P1 frequency. Practically, toggling PA in the middle of Φ (or #Φ) is equivalent as sampling again the $C_{IN}*$(VinP−VinM) charge into the input capacitor. However, sampling VinP−VinM this way does not consume any charge (assuming zero offset on the amplifier input) since the voltage on the capacitor does not change. Thus switching PA in the middle of Φ saves the sampling charge from the input source. Only the transfer charge (equal to the sampling charge) is consumed from the input. Thus the current consumption on the input is divided by 2 inducing a doubled input impedance.

In FIG. 2, signals Φ, PA and P1 are digital logic switching signals whereas OP-OM is an analog output signal indicated by the rising and falling slopes. As can be seen, the amplifier output OP-OM still toggles between 0 an $2C_{IN}/C_{FB}$(VinP−VinM) while input impedance is doubled. The effective average differential input impedance during a full clock cycle Φ is still: $Z_{IN}\text{diff}=1/(2*f*C_{IN})$ where f is the clock frequency of the Φ signal, which is logical because the input switching circuit has not changed and the addition of the switches 120a,b and 122a,b is not changing the voltage of the second terminal of the input capacitors 110a,b (provided that there is no offset voltage at the input of the amplifier 140). However, since the signal transfer at the outputs of the operational amplifier is now happening at twice the rate (once per toggle of the Φ clock signal) than FIG. 4, the frequency of the signal Φ can be divided by two to keep the same transfer rate than FIG. 4. Thus, this switching algorithm permits a doubling of the input impedance compared to the standard switching, with the only addition of 4 switches and the necessary logic to generate phases PA and P1.

According to further embodiments, removing the switches 150a/b leads to an integrator structure that combines also the offset cancellation and the improved input impedance. This structure integrates also $2*C_{IN}/C_{fb}*$(VinP−VinM) each time Φ is toggling, thus at each Clock period at the P1 frequency. Hence, a person skilled in the art will appreciate that the various embodiments are not restricted to programmable gain amplifiers but any type of switched capacitor circuits. A skilled person will notice that for fast integrator applications PA may be synchronous with Φ. However the offset cancellation will only occur if the output is averaged during a full clock period Φ.

Figure 3:
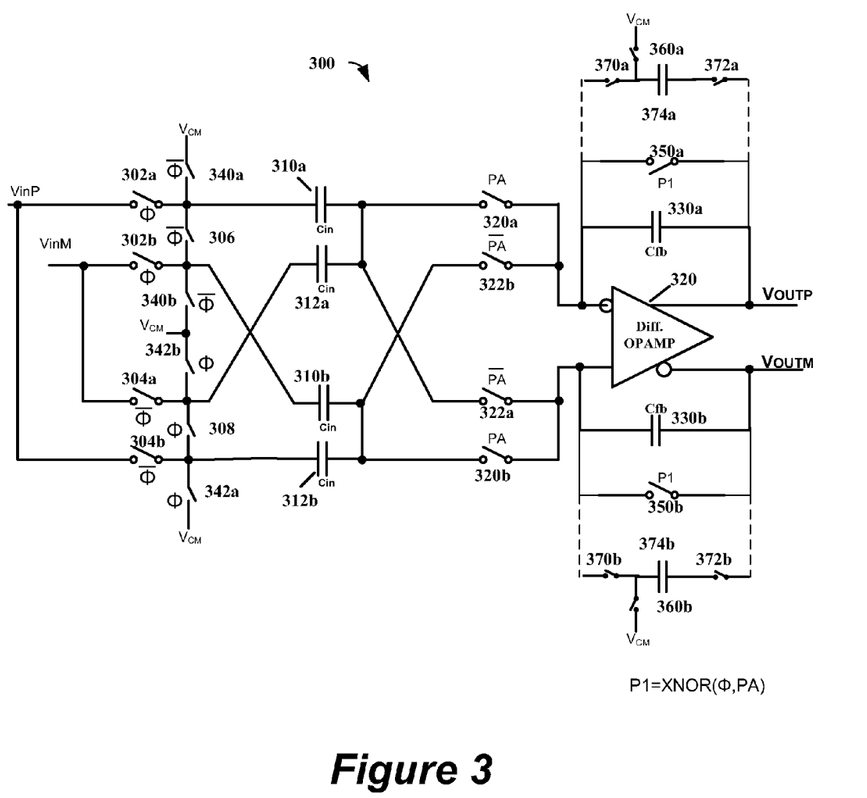
FIG. 3 shows a second embodiment of an improved gain amplifier.

FIG. 3 shows a second embodiment of a gain amplifier wherein the input impedance is quadrupled compared to the case of the FIG. 4. Instead of a single capacitor 110a, b in the non-inverting and inverting input path as shown in FIG. 1, two capacitors 310a, 312a and 310b, 312b are provided for each input path of the differential gain amplifier. In this embodiment capacitor 310a corresponds to capacitor 110a and capacitor 310b to capacitor 110b. Furthermore, switches 302a, b, 320a, b and 322a, b correspond to switches 102a, b, 120a, b and 122a and 122b.

In addition to the case of the FIG. 1, a third capacitor 312a is provided whose second terminal is coupled with the second terminal of the first capacitor 310a. Similarly, a fourth capacitor 312b is provided whose second terminal is coupled with the second terminal of capacitor 310b. The first terminal of capacitor 312a is coupled with the input VinM via switch 304a and the first terminal of capacitor 312b is coupled with the input VinP via switch 304b. Furthermore, switch 306 is provided which couples the first terminals of capacitors 310a and 310b. To this end, switch 306 is arranged after switches 302a, b with respect to the input signal flow. Similarly, switch 308 is provided to couple the first terminals of capacitors 312a and 312b. This switch is also arranged behind switches 304a, b.

Switches 302a, b and 308 are controlled by clock signal Φ and switches 304a, b and 306 are controlled by the inverted clock signal #Φ. The control of the phase switches 320a, b and 322a, b is identical to the circuit shown in FIG. 1. Hence, the signals shown in FIG. 2 also apply to FIG. 3.

In addition, FIG. 3 shows further switches 340a, b and 342a,b which can provide additional functionality which is not essential to the various embodiments shown. These switches allow to couple the first terminals of capacitors 310a, b and 312a, b with a reference potential VCM, for example ground. Switches 340a/b are controlled by #Φ. Switches 342a/b are controlled by Φ. These switches can also be used to place a known potential on the left side of the capacitors at the power-up of the circuit so that this node is not floating to start with.

Also shown in FIG. 3 are the feedback capacitors 330a, b which correspond to capacitors 130a, b, respectively. As mentioned above, switches 350a, b act like the switches 150a,b in FIG. 1 and provide a discharge path for the feedback capacitors which again is not essential to the various embodiments. These switches also permit to have a fixed potential at power up. Switches 350a, b are controlled by the clock phase P1. Also, FIG. 3 shows additional feedback capacitors 360a, b and associates switches 370a, b; 372a, b; and 374a, b connected by dotted lines. Multiple such capacitor/switch combinations can be provided for the gain programming function of a programmable gain amplifier (PGA). Similar modification can also be applied to the circuit shown in FIG. 1 according to various embodiments, even though this extra circuitry isn't shown in FIG. 1. According to further embodiments, removing the switches 350a/b leads to an integrator structure that combines also the offset cancellation and the improved input impedance. This structure integrates also $2*C_{IN}/C_{fb}*(VinP-VinM)$ at each Clock period at the P1 frequency. Hence, a person skilled in the art will appreciate that the various embodiments are not restricted to programmable gain amplifiers but many type of switched capacitor circuits such as gain stages, integrating stages, comparator stages, etc.

With the structure as shown in FIG. 3, either the first terminal of capacitor 310a and 310b is connected to the inputs VinP, VinM, respectively (during an enabled $\Phi$) or they are shorted together by means of switches 306 (during an enabled #$\Phi$). Similarly, the first terminal of capacitors 112a, b are connected either to the inputs VinM, VinP, respectively (during enabled #$\Phi$) or are shorted together via switch 308 (during enabled $\Phi$).

The differential voltage between the input terminals of 310a and 310b changes from 0 in phase #$\Phi$ to VinP-VinM in phase $\Phi$ while the second terminal differential voltage is always zero (connected to the inputs of the operational amplifier 320). When the phase $\Phi$ is enabled, the differential charge change on the capacitors 310a,b between phases #$\Phi$ and $\Phi$ is then equal to:

$$\Delta Q_{IN}(310a,b)(\#\Phi,\Phi)=C_{IN}*(VinP-VinM).$$

The differential voltage between the input terminals of 312a and 312b changes from VinM-VinP in phase #$\Phi$ to 0 in phase $\Phi$ while the second terminal differential voltage is always zero (connected to the inputs of the operational amplifier 320).

The same calculation applies to the capacitors 312a,b:

$$\Delta Q_{IN}(312a,b)(\#\Phi,\Phi)=C_{IN}*(VinP-VinM).$$

So the total charge change between the phase #$\Phi$ and $\Phi$ is equal to:

$$\Delta Q_{INTotal}(\#\Phi,\Phi)=\Delta Q_{IN}(310a,b)(\#\Phi,\Phi)+\Delta Q_{IN}(312a,b)(\#\Phi,\Phi)=2*C_{IN}*(VinP-VinM).$$

Similarly, the calculation applies to the change between the phases $\Phi$ and #$\Phi$ and the calculation gives the opposite sign result:
$$\Delta Q_{INTotal}(\Phi,\#\Phi)=\Delta Q_{IN}(310a,b)(\Phi,\#\Phi)+\Delta Q_{IN}(312a,b)(\Phi,\#\Phi)=2*C_{IN}*(VinM-VinP).$$

The total charge transferred is here equal to the cases of the FIGS. 1 and 4 cases. This shows that the output voltage is the same amplitude than the previous cases, which is the goal of this algorithm.

For the input impedance calculation tough, the FIG. 3 shows an improvement compared to the case of the FIG. 1. During each phase, only half of the capacitances 310a,b are connected to the input VinP and only half of the capacitances 312a,b are connected to the input VinM. The other half of these capacitances is shorted together and does not consume any current from the source, since it is not physically connected to either VinM or VinP. The total differential input impedance calculation should then take in account only the charges that are consumed from the source. During half of the period of the clock $\Phi$, when $\Phi$ is enabled, only the capacitors 310a,b consume charge from the inputs (therefore only the charge stored on these capacitors count in the calculation of the input impedance). Similarly, during the other phase #$\Phi$, only the capacitors 312a,b consume charge from the inputs. $Z_{INdiff}=2/f*Output$ Voltage transferred/($\Delta Q_{IN}(310a,b)$) (#$\Phi$,$\Phi$))+2/f*Output Voltage transferred/($\Delta Q_{IN}(312a,b)$) ($\Phi$,#$\Phi$)) $=2/(f*C_{IN}$ where f is the frequency of phase $\Phi$. This shows by calculation a doubling of the input impedance, while the same quantity of voltage is present at the output of the operational amplifier compared to the case of the FIG. 1.

According to various embodiments, with this technique, the input impedance can be doubled or quadrupled, which effectively cuts the input current in half or a quarter while the input voltage remains the same, with very little overhead while keeping the same signal-to-noise ratio performance. The additional optional reset switches 340a, b and 342a, b can be controlled to connect the capacitors to a common mode voltage in order to properly startup with no charge stored on the capacitors. The control of the phase switches 320a, b and 322a, b is the same as in the circuit shown in FIG. 1. As mentioned above, the switches 120a/b and 122 a/b or 320a/b and 322 a/b also induce a chopper algorithm at the inputs of the operational amplifier 120/320 and therefore lead to an offset cancellation if the outputs are averaged over time during an integer number of $\Phi$ clock cycles.

It should further be noted that in all the above descriptions only the main switching principle (timing) is described. Hence, this principle can be further enhanced by using non-overlapping delays rules between switches. Other modification can be performed without departing from the scope of the claims. A skilled designer will notice that multiple gain can be as well achieved through a programmable $C_{IN}$ capacitor in the input section, or having several input section connected in parallel at the input and being activated or disabled as a function of the gain desired. However the input impedance will depend on the gain selected. When a large range of gain is required both $C_{IN}$ and $C_{fb}$ value can be programmed.

What is claimed is:

1. A gain amplifier comprising:
a differential amplifier comprising first and second feedback capacitors and switches coupled in parallel to the first and second feedback capacitors wherein said switches are controlled by a control signal toggled at twice the frequency of a clock signal and a phase-shifted clock signal;
a switched input stage having a first and second output coupled with the differential amplifier, comprising:
first and second capacitors,
a first input receiving a first signal of a differential input signal;
a second input receiving a second signal of the differential input signal;
a first plurality of switches controlled by the clock signal to connect the first terminal of the first capacitor with said first or second input, respectively and to connect the first terminal of the second capacitors with said second and first input, respectively; and
a second plurality of switches controlled by the phase-shifted clock signal to connect the second terminal of the first capacitor with a first or second input of the differential amplifier and connecting the second terminal of the second capacitor with the second or first input of the differential amplifier.

2. The gain amplifier according to claim 1, wherein the phase shifted signal is the clock signal shifted by ¼ period.

3. The gain amplifier according to claim 1, wherein the first plurality of switches comprises:
   a first switch coupled between the first input and the first terminal of the first capacitor;
   a second switch coupled between the second input and the first terminal of the first capacitor;
   a third switch coupled between the first input and the first terminal of the second capacitor;
   a fourth switch coupled between the second input and the first terminal of the second capacitor;
   wherein the first and third switch are controlled by the clock signal and the second and fourth switch are controlled by an inverted clock signal.

4. The gain amplifier according to claim 3, wherein the second plurality of switches comprises:
   a fifth switch coupled between the second terminal of the first capacitor and the first input of the differential amplifier;
   a sixth switch coupled between the second terminal of the second capacitor and the first input of the differential amplifier;
   a seventh switch coupled between the second terminal of the first capacitor and the second input of the differential amplifier;
   a eighth switch coupled between the second terminal of the second capacitor and the second input of the differential amplifier;
   wherein the fifth and eighth switch are controlled by the phase shifted clock signal and the sixth and seventh switch are controlled by an inverted phase shifted signal.

5. The gain amplifier according to claim 1, wherein the differential amplifier integrates the input signal by means of a first and second feedback capacitor.

6. The gain amplifier according to claim 1, wherein the control signal is generated by an exclusive or gate coupled with the clock signal and the shifted clock signal.

7. The gain amplifier according to claim 1, further comprising at least one switchable feedback network in each feedback loop which can be switched in parallel to said feedback capacitor to control the gain of said gain amplifier.

8. The gain amplifier according to claim 7, wherein the switchable feedback network comprises first and second coupling switches connected to a further feedback capacitor and operable to couple the further capacitor in parallel with a feedback capacitor.

9. The gain amplifier according to claim 8, wherein the switchable feedback network comprises a reset switch which couples the further feedback capacitor with a common mode voltage.

10. The method according to claim 8, wherein the switching of the first terminals of the first and third capacitors is performed by
   a first switch coupled between the first input and the first terminal of the first capacitor; and
   a second switch coupled between the second input and the first terminal of the third capacitor;
   the shorting of the second and fourth capacitors is performed by
   a third switch coupled between the first terminals of the second and fourth capacitor;
   the switching of the first terminals of the second and fourth capacitors is performed by
   a fourth switch coupled between the first input and the first terminal of the second capacitor;
   a fifth switch coupled between the second input and the first terminal of the fourth capacitor;
   and the shorting of the first and third capacitor is performed by
   a sixth switch coupled between the first terminals of the first and third capacitor.

11. The method according to claim 10, wherein the first, second and sixth switch is controlled by the clock signal and the third, fourth and fifth switch is controlled by an inverted clock signal.

12. The method according to claim 10, wherein switching the second terminals of the first and fourth capacitor is performed by
   a seventh switch coupled between the second terminal of the first and fourth capacitors and the first input of the differential amplifier; and
   an eight switch coupled between the second terminal of the first and fourth capacitors and the second input of the differential amplifier;
   and the switching the second terminals of the second and third capacitor is performed by
   a ninth switch coupled between the second terminal of the second and third capacitors and the first input of the differential amplifier;
   a tenth switch coupled between the second terminal of the second and third capacitors and the second input of the differential amplifier;
   wherein the seventh and ninth switch are controlled by the phase shifted clock signal and the eight and tenth switch are controlled by an inverted phase shifted signal.

13. The gain amplifier according to claim 1, further comprising:
   a third and fourth capacitor;
   wherein the first plurality of switches are controlled by the first clock signal to connect the first terminals of the first and third capacitors with said first and second input, respectively while shorting the first terminals of the second and fourth capacitors or to connect the first terminals of the second and fourth capacitors with said first and second input, respectively while shorting the first terminals of the first and third capacitors; and
   wherein the second plurality of switches are controlled by the phase shifted clock signal to connect the second terminals of the first and third capacitors with a first input of the differential amplifier while connecting the second terminals of the second and fourth capacitors with the second input of the differential amplifier or to connect the second terminals of the first and third capacitors with a second input of the differential amplifier while connecting the second terminals of the second and fourth capacitors with the first input of the differential amplifier.

14. The gain amplifier according to claim 13, wherein the first plurality of switches comprises:
   a first switch coupled between the first input and the first terminal of the first capacitor;
   a second switch coupled between the second input and the first terminal of the third capacitor;
   a third switch coupled between the first terminals of the first and third capacitor;
   a fourth switch coupled between the first input and the first terminal of the fourth capacitor;
   a fifth switch coupled between the second input and the first terminal of the second capacitor;
   a sixth switch coupled between the first terminals of the second and fourth capacitor;

wherein the first, second and sixth switch is controlled by the clock signal and the third, fourth and fifth switch is controlled by an inverted clock signal.

15. The gain amplifier according to claim 14, wherein the second plurality of switches comprises:
  a seventh switch coupled between the second terminal of the first and third capacitors and the first input of the differential amplifier;
  an eight switch coupled between the second terminal of the second and fourth capacitors and the first input of the differential amplifier;
  a ninth switch coupled between the second terminal of the first and third capacitors and the second input of the differential amplifier;
  a tenth switch coupled between the second terminal of the second and fourth capacitors and the second input of the differential amplifier;
  wherein the seventh and tenth switches are controlled by the phase shifted clock signal and the eight and ninth switch are controlled by an inverted phase shifted signal.

16. The gain amplifier according to claim 13, further comprising a third input receiving a common mode voltage and a third plurality of switches operable to individually connect the first terminals of said first, second, third and fourth capacitors with the common mode voltage.

17. The gain amplifier according to claim 13, wherein the common mode voltage is ground.

18. The gain amplifier according to claim 1, further comprising first and second reset switches coupled in parallel to a first and second feedback capacitor.

19. The gain amplifier according to claim 18, further comprising at least one switchable feedback network in each feedback loop which can be switched in parallel to said feedback capacitor to control the gain of said gain amplifier.

20. The gain amplifier according to claim 19, wherein the switchable feedback network comprises first and second coupling switches connected to a further feedback capacitor and operable to couple the further capacitor in parallel with a feedback capacitor.

21. The gain amplifier according to claim 20, wherein the switchable feedback network comprises a reset switch which couples the further feedback capacitor with a common mode voltage.

22. A method for operating a gain amplifier with a differential amplifier comprising feedback capacitors, comprising:
  switching a first terminal of a first capacitor to connect with a first or second input and switching a first terminal of a second capacitor to connect with a second or first input depending on a clock signal; and
  switching the second terminals of the first and second capacitor to connect to either a first or second input of the differential amplifier according to a phase shifted clock signal wherein the phase-shifted signal is the clock signal shifted by ¼ period of the clock signal.

23. The method according to claim 22, wherein the differential amplifier comprises feedback capacitors and is controlled to integrated the input signals.

24. The method according to claim 23, further comprising switching at least one switchable feedback network in parallel to said feedback capacitor to control the gain of said gain amplifier.

25. The method according to claim 24, wherein the switchable feedback network comprises first and second coupling switches connected to a further feedback capacitor and operable to couple the further capacitor in parallel with a feedback capacitor.

26. The method according to claim 25, wherein coupling the further feedback capacitor with a common mode voltage to define a reset state.

27. The method according to claim 22, wherein the differential amplifier comprises feedback capacitors and parallel reset switches which are controlled to short the feedback capacitors with a control signal.

28. The method according to claim 27, wherein the control signal has twice the frequency of the clock signal.

29. The method according to claim 28, wherein the control signal is generated by an exclusive or of the clock signal and the shifted clock signal.

30. The method according to claim 22, further comprising connecting the first terminals of at least one of said first, second, capacitors with a common mode voltage to define a reset state.

31. The method according to claim 30, wherein the common mode voltage is ground.

32. The method according to claim 22, wherein third and fourth capacitors are provided for sampling, the method further comprising:
  switching first terminals of the first and third capacitor to connect with the first and second input, respectively while shorting first terminals of the second and fourth capacitor when the clock signal is in a first state and switching first terminals of the second and fourth capacitor to connect with the second and first input, respectively while shorting first terminals of the first and third capacitor when the clock signal is in a second state;
  switching the second terminal of the first and fourth capacitor to connect to the first input of the differential amplifier and the second terminal of the second and third capacitor to connect to the second input of the differential amplifier when the phase shifted clock signal is in a first state and switching the second terminal of the first and fourth capacitor to connect to the second input of the differential amplifier and the second terminal of the second and third capacitor to connect to the first input of the differential amplifier when the phase shifted clock signal is in a second state.

33. The method according to claim 32, further comprising connecting the first terminals of at least one of said first, second, third, and fourth capacitors with a common mode voltage to define a reset state.

34. The method according to claim 33, wherein the common mode voltage is ground.

35. The method according to claim 32, wherein the differential amplifier comprises feedback capacitors and parallel reset switches which are controlled to short the feedback capacitors with a control signal.

36. The method according to claim 35, wherein the control signal has twice the frequency of the clock signal.

37. The method according to claim 36, wherein the control signal is generated by an exclusive or of the clock signal and the shifted clock signal.

38. The method according to claim 32, further comprising switching at least one switchable feedback network in parallel to a feedback capacitor to control the gain of said gain amplifier.

39. The method according to claim 38, wherein the switchable feedback network comprises first and second coupling switches connected to a further feedback capacitor and operable to couple the further capacitor in parallel with a feedback capacitor.

40. The method according to claim 39, wherein coupling the further feedback capacitor with a common mode voltage to define a reset state.

41. A Sigma delta analog to digital converter comprising a gain amplifier comprising:
- a differential amplifier comprising feedback capacitors;
- a switched input stage having a first and second output coupled with the differential amplifier, comprising:
  - a first, second, third and fourth capacitor, wherein the first and second capacitor form a first set wherein second terminals of the first and second capacitors are connected and third and fourth capacitors form a second set wherein second terminals of the third and fourth capacitors are connected;
  - a first input receiving a non-inverted input signal;
  - a second input receiving an inverted input signal;
  - a first plurality of switches controlled by a first clock signal to connect the first terminals of the capacitors of the first set with said first and second input, respectively while shorting the first terminals of the capacitors of the second set or to connect the first terminals of the capacitors of the second set with said first and second input, respectively while shorting the first terminals of the capacitors of the first set; and
  - a second plurality of switches controlled by a phase shifted clock signal to connect the second terminals of the capacitors of the first set with a first input of the differential amplifier while connecting the second terminals of the capacitors of the second set with the second input of the differential amplifier or to connect the second terminals of the capacitors of the first set with a second input of the differential amplifier while connecting the second terminals of the capacitors of the second set with the first input of the differential amplifier.

* * * * *